United States Patent
Shim et al.

(10) Patent No.: US 7,041,526 B2
(45) Date of Patent: May 9, 2006

(54) MAGNETIC FIELD DETECTING ELEMENT AND METHOD FOR MANUFACTURING THE SAME

(75) Inventors: Dong-sik Shim, Seoul (KR); Kyung-won Na, Yong-si (KR); Sang-on Choi, Suwon-si (KR); Hae-seok Park, Seoul (KR); Jun-sik Hwang, Ohsan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/784,479

(22) Filed: Feb. 23, 2004

(65) Prior Publication Data

US 2005/0006713 A1    Jan. 13, 2005

(30) Foreign Application Priority Data

Feb. 25, 2003   (KR) .................. 10-2003-0011807
May 28, 2003    (KR) .................. 10-2003-0034191

(51) Int. Cl.
*G01R 33/02*     (2006.01)
*H01L 21/00*     (2006.01)

(52) U.S. Cl. ............................. 438/48; 438/3
(58) Field of Classification Search ............. 438/3, 438/48; 257/421–427, 531
See application file for complete search history.

(56) References Cited

U.S. PATENT DOCUMENTS 5,070,317 A * 12/1991 Bhagat ................. 336/200
6,030,877 A *  2/2000 Lee et al. ............. 438/381
6,166,422 A * 12/2000 Qian et al. ............ 257/531
6,411,086 B1   6/2002 Choi et al.
6,414,564 B1   7/2002 Mizoguchi et al.
6,429,651 B1   8/2002 Choi et al.
2004/0244488 A1* 12/2004 Tang et al. ............. 73/579

FOREIGN PATENT DOCUMENTS

| DE | 42 20 186 | 12/1993 |
| EP | 1 345 038 | 9/2003 |
| EP | 1 441 234 | 7/2004 |
| EP | 1 447 674 | 8/2004 |

* cited by examiner

*Primary Examiner*—Howard Weiss
*Assistant Examiner*—Marcos D. Pizarro-Crespo
(74) *Attorney, Agent, or Firm*—Lee & Morse, P.C.

(57) ABSTRACT

A method for manufacturing a magnetic field detecting element having a soft magnetic core formed on a substrate, first and second coils, each having coil lines, arranged above and below the core, the method including forming a seed film on the substrate, removing a portion of the seed film using a predetermined pattern so that coil lines constituting the first coil subsequently formed on the seed film are separated, forming a first plating mold having grooves corresponding to the predetermined pattern on an upper portion of the seed film, forming coil lines constituting the first coil by filling the grooves of the first plating mold with metal, forming the soft magnetic core and the second coil on an upper portion of the substrate and on the seed film where the first coil is formed, and cutting off edges of the substrate so that the separated coil lines are insulated.

8 Claims, 15 Drawing Sheets

MAGNETIC FIELD DETECTING ELEMENT AND METHOD FOR MANUFACTURING THE SAME

BACKGROUND OF THE INVENTION

1. Field of the Invention

The present invention relates to a magnetic field detecting element and a method for manufacturing the same. More particularly, the present invention relates to a magnetic field detecting element and a method for manufacturing the same by forming a soft magnetic core and a coil in a thin film type on a semiconductor substrate using a semiconductor process.

2. Description of the Related Art

Conventionally, a high sensitivity magnetic sensor has included a soft magnetic material and a coil. Such a magnetic sensor is generally manufactured by winding a coil on a soft magnetic core, and requires an electronic circuit for obtaining a magnetic field proportional to a measured magnetic field. Recently, a method for realizing a magnetic field detecting element of such a magnetic sensor has been suggested, in which a soft magnetic thin film core and a plane thin film coil are formed on a semiconductor substrate using a semiconductor process.

A general method for manufacturing a magnetic field detecting element using a semiconductor process is illustrated in FIGS. 1A through 1J.

Referring to FIG. 1A, a first seed film 2 is formed on a semiconductor substrate 1. A photoresist of a predetermined height (not shown) is formed on the first seed film 2. In FIG. 1B, a first plating mold 3 having a plurality of grooves 3a is formed by exposing and developing the photoresist. Next, the grooves 3a of the first plating mold 3 are filled with metal by a process, e.g., electric plating, so that a plurality of coil lines 4a, 4b, etc. are formed, as shown in FIG. 1C. Then, the first plating mold 3 and the seed film under the first plating mold 3 are removed, thereby forming a first coil 4 consisting of a plurality of coil lines 4a, 4b, etc., which are insulated from each other, as shown in FIG. 1D.

After the first coil 4 is formed, a first insulating film 5 is formed to cover the first coil 4 on the semiconductor substrate 1, as shown in FIG. 1E. Then, a soft magnetic material film (not shown) is formed on an upper surface of the first insulating film 5, and the soft magnetic material film is patterned and etched to form a soft magnetic core 6, as shown in FIG. 1F.

Subsequently, a second insulating film 7 of a predetermined thickness is formed on the soft magnetic core 6 of the semiconductor substrate 1, as shown in FIG. 1G. Then, as shown in FIG. 1H, via holes 8a and 8b for communicating with the coil lines 4a and 4o at either end of the first coil 4, are formed, and a second seed film 9 is formed to a predetermined thickness on an upper surface of the second insulating film 7. Next, a thick photoresist (not shown) is formed on the second seed film 9 and a second plating mold 10 having a plurality of grooves 10a and having the via holes 8a, 8b formed therethrough is formed by exposing and developing the thick photoresist.

As shown in FIG. 1I, metal is formed in the plurality of grooves 10a of the second plating mold 10 so that a plurality of coil lines 11a, 11b, etc. is formed. Then, the second plating mold 10 and the second seed film 9 under the second plating mold 10 are removed, thereby forming a second coil 11 consisting of the plurality of coil lines 11a, 11b, etc., which are insulated each other, as shown in FIG. 1J.

Finally, although not shown, a protection film is spread on an upper portion of the second coil 11, whereby manufacturing of the magnetic field detecting element is complete.

However, according to the foregoing general method for manufacturing the magnetic field detecting element, the seed film 2 between the coil lines 4a, 4b, etc. should be removed so that the coil lines 4a, 4b, etc. constituting the first coil 4 are insulated from each other. For that purpose, after the first plating mold 3 is removed, the insulating film 5 must be formed on the first coil 4 for subsequent processes, thereby complicating the manufacturing process.

In addition, performance of the soft magnetic core 6 in the foregoing magnetic field detecting element is poor because the semiconductor substrate 1 for supporting the soft magnetic core 6 is uneven. Since the first coil 4 is projected onto the semiconductor substrate 1, the general magnetic field detecting element has a weakness in that the thickness of the first and the second insulating films 5, 7 may become thick. If the insulating films 5, 7 become thick, not only does the entire element become thick, but the process for forming the via holes 8a, 8b, which connect the first coil 4 with the second coil 11, becomes difficult. Also, a pitch between the coil lines, which influences performance of the sensor becomes large, causing further negative effects in the element.

SUMMARY OF THE INVENTION

The present invention is therefore directed to a magnetic field detecting element and a method for manufacturing the same, which substantially overcome one or more of the problems due to the limitations and disadvantages of the related art.

It is a feature of an embodiment of the present invention to provide a method for manufacturing a magnetic field detecting element having a simple manufacturing process, in which a plating mold need not be removed for removal of a seed film to provide insulation between coil lines, thereby reducing restrictions on a material suitable for use as an insulating film.

It is another feature of an embodiment of the present invention to provide a method for manufacturing a magnetic field detecting element having a simple manufacturing process, in which planarization of a semiconductor substrate on which a coil is formed may be easily performed, and in which a thickness of a planarization material and a film for constructing the magnetic field detecting element are thin.

It is still another feature of an embodiment of the present invention to provide a magnetic field detecting element having improved performance manufactured by a simplified process.

At least one of the above and other features and advantages of the present invention may be realized by providing a method for manufacturing a magnetic field detecting element having a soft magnetic core formed on a semiconductor substrate, first and second coils arranged on upper and lower surfaces of the soft magnetic core, respectively, the first and second coils each having a plurality of coil lines, the method including forming a seed film to a predetermined thickness on the semiconductor substrate, removing a portion of the seed film using a predetermined pattern so that each of the plurality of coil lines constituting the first coil that is subsequently formed on a remaining portion of the seed film is separated from the others, forming a first plating mold having a plurality of grooves corresponding to the predetermined pattern, on an upper portion of the seed film, forming the plurality of coil lines constituting the first coil by filling the plurality of grooves of the first plating mold with metal, forming the soft magnetic core and the second coil on an upper portion of the semiconductor substrate and on the remaining portion of the seed film where the first coil is formed, and cutting off edges of the semiconductor substrate so that each of the plurality of coil lines separated by the predetermined pattern are insulated from each other.

Removing the portion of the seed film may further include forming a photoresist layer on an upper surface of the seed film, exposing and developing the photoresist to form the predetermined pattern, and etching the seed film according to the predetermined pattern.

Filling the plurality of grooves of the first plating mold with metal may include electric plating.

Forming the soft magnetic core may further include planarizing an upper surface of the semiconductor substrate on which the first coil is formed, spreading an insulating film on the planarized upper surface of the semiconductor substrate, spreading a soft magnetic material film on an upper surface of the insulating film, forming a photoresist layer on the soft magnetic material film and exposing and developing the photoresist layer to form a pattern of the soft magnetic core, and etching the soft magnetic material film according to the pattern.

Forming the soft magnetic core may include removing the first plating mold, forming an insulating film to a height greater than a height of the first coil on an upper surface of the semiconductor substrate from which the first plating mold has been removed, spreading a soft magnetic material film on an upper surface of the insulating film, forming a photoresist layer on the soft magnetic material film and exposing and developing the photoresist layer to form a pattern of the soft magnetic core, and etching the soft magnetic material film according to the pattern.

At least one of the above and other features and advantages of the present invention may be realized by providing a method for manufacturing a magnetic field detecting element having a soft magnetic core formed on a semiconductor substrate, first and second coils respectively arranged on upper and lower surfaces of the soft magnetic core, the first and second coils each having a plurality of coil lines, the method including forming a first seed film to a predetermined thickness on the semiconductor substrate, removing a portion of the first seed film using a predetermined first pattern so that each of the plurality of coil lines constituting the first coil to be subsequently formed on the first seed film is separated from the others, forming a first plating mold having a plurality of grooves that corresponds to the predetermined first pattern, on an upper portion of the first seed film, forming the plurality of coil lines constituting the first coil by filling the plurality of grooves of the first plating mold with metal, forming the soft magnetic core on the semiconductor substrate where the first coil is formed, forming a second insulating film on the semiconductor substrate where the soft magnetic core is formed, forming a second seed film on an upper surface of the second insulating film, removing the second seed film using a predetermined second pattern so that a plurality of coil lines constituting the second coil to be subsequently formed on the second seed film are separated from each other, forming a second plating mold having a plurality of grooves corresponding to the second pattern, on an upper portion of the second seed film, forming a plurality of coil lines constituting the second coil by filling the plurality of grooves of the second plating mold with metal, and cutting off edges on sides of the semiconductor substrate so that each of the plurality of coil lines constituting the first and the second coils separated by the first and the second patterns are insulated from each other.

Filling the plurality of grooves of the first and the second plating molds with metal may include electric plating.

Forming the soft magnetic core may further include planarizing an upper surface of the semiconductor substrate on which the first coil is formed, spreading a first insulating film on the planarized upper surface of the semiconductor substrate, spreading a soft magnetic material film on an upper portion of the first insulating film, forming a photoresist layer on the soft magnetic material film and exposing and developing the photoresist layer to form a pattern of the soft magnetic core, and etching the soft magnetic material film according to the pattern.

At least one of the above and other features and advantages of the present invention may be realized by providing a method for manufacturing a magnetic field detecting element, including forming a well to a predetermined depth in a semiconductor substrate, forming a first coil on the semiconductor substrate, the first coil being arranged within the well below an upper surface of the semiconductor substrate, forming a first insulating film on an upper portion of the first coil and forming a soft magnetic core on an upper portion of the first insulating film, forming a second insulating film on an upper portion of the soft magnetic core, and forming a second coil on an upper portion of the second insulating film.

At least one of the above and other features and advantages of the present invention may be realized by providing a method for manufacturing a magnetic field detecting element including preparing a semiconductor substrate, forming a well to a predetermined depth in the semiconductor substrate, forming a first coil consisting of a plurality of coil lines within the well of the semiconductor substrate, forming a first insulating film on an upper portion of the semiconductor substrate including the well, forming a soft magnetic core on an upper portion of the first insulating film, forming a second insulating film on an upper portion of the first insulating film including the soft magnetic core, and forming a second coil corresponding to the first coil, on an upper portion of the second insulating film.

Forming the well may include etching inner sidewalls of the well to be gradually inclined from an upper portion of the well to a bottom of the well.

Forming the first coil may further include forming a first seed film on a surface of the well, forming a first plating mold having a plurality of grooves on the first seed film, forming a plurality of coil lines constituting the first coil by filling the plurality of grooves of the first plating mold with metal, and removing the first plating mold and the first seed film under the first plating mold.

Filling the plurality of grooves of the first plating mold with metal may include electric plating.

Forming the second coil may further include forming a via hole by etching the first and second insulating films on both sides of the soft magnetic core, forming a second seed film on an upper surface of the second insulating film in which the via hole is formed, forming a second plating mold having a plurality of grooves on the second seed film, forming a plurality of coil lines constituting a second coil by filling the plurality of grooves of the second plating mold with metal and connecting the first coil with the second coil through the via hole, and removing the second plating mold and the second seed film under the second plating mold.

Filling the plurality of grooves of the second plating mold with metal may include electric plating.

The method may further include forming a protection film on the semiconductor substrate including the second coil to protect a structure formed thereon.

At least one of the above and other features and advantages of the present invention may be realized by providing a magnetic field detecting element including a semiconductor substrate, a soft magnetic core formed on an upper portion of the semiconductor substrate, an insulating film positioned on an upper and a lower portions of the soft magnetic core, and first and second coils, each including a plurality of coil lines, formed to enclose the soft magnetic core with the insulating film intervening therebetween, wherein a well of a predetermined depth is formed in the semiconductor substrate and the plurality of coil lines constituting the first coil are arranged within the well.

A height of the coil lines and a depth of the well may be the same.

The first coil may be positioned at a lower portion of the soft magnetic core and the second coil may be positioned at an upper portion of the soft magnetic core, and the plurality of coil lines of the first and second coils may be connected by a third coil filling a via hole formed through the insulating film on both sides of the soft magnetic core.

Inner sidewalls of the well may be gradually inclined from an upper portion of the well to a bottom of the well.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1A:
FIGS. 1A through 1J illustrate cross-sectional views of stages in a general method for manufacturing a magnetic field detecting element.
Figure 1B:
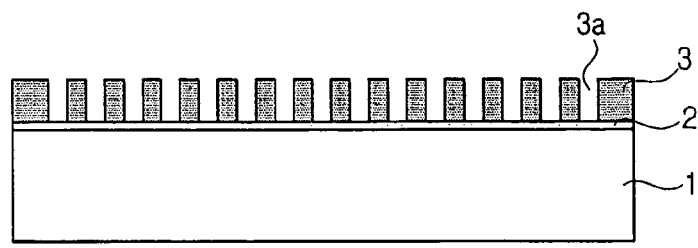
Figure 1C:
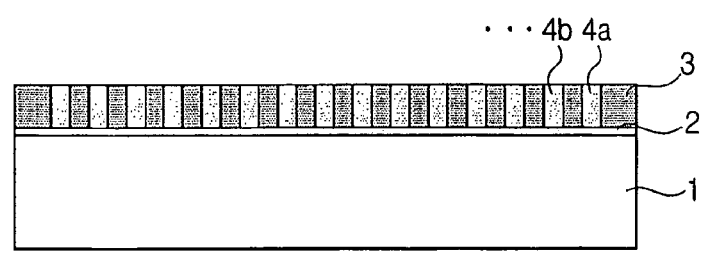
Figure 1D:
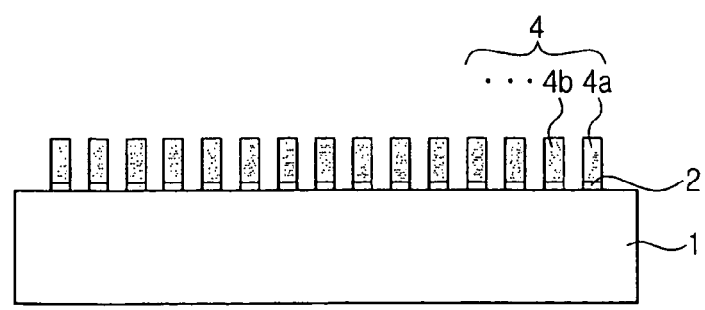
Figure 1E:
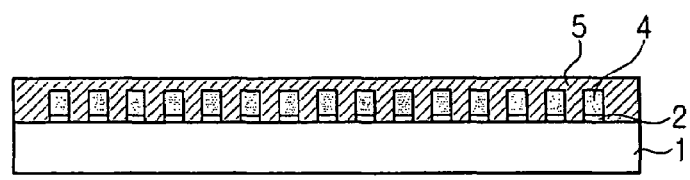
Figure 1F:
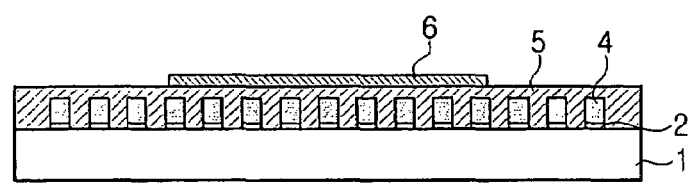
Figure 1G:
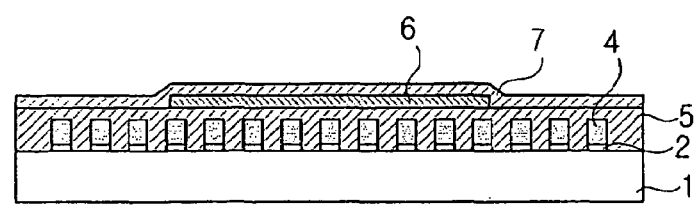
Figure 1H:
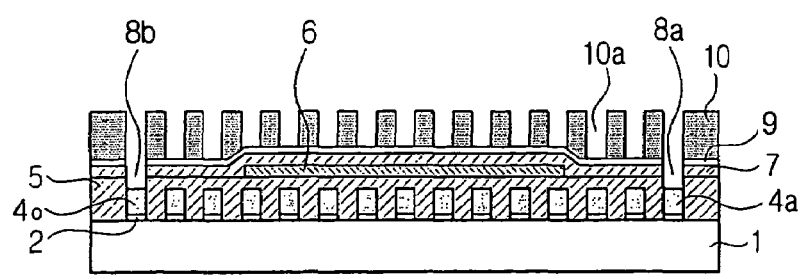
Figure 1I:
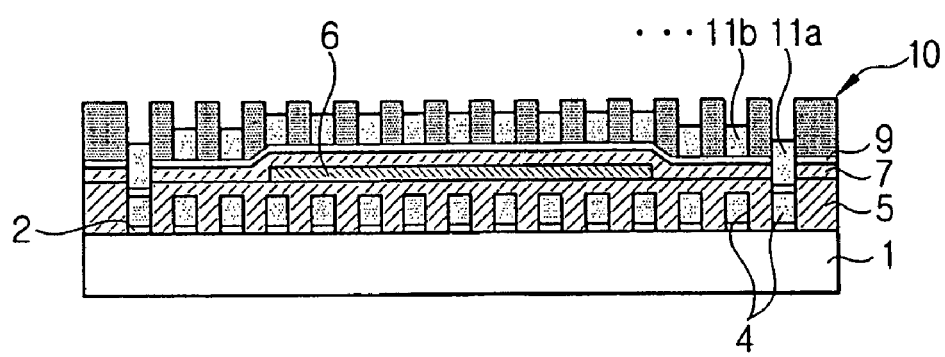
Figure 1J:
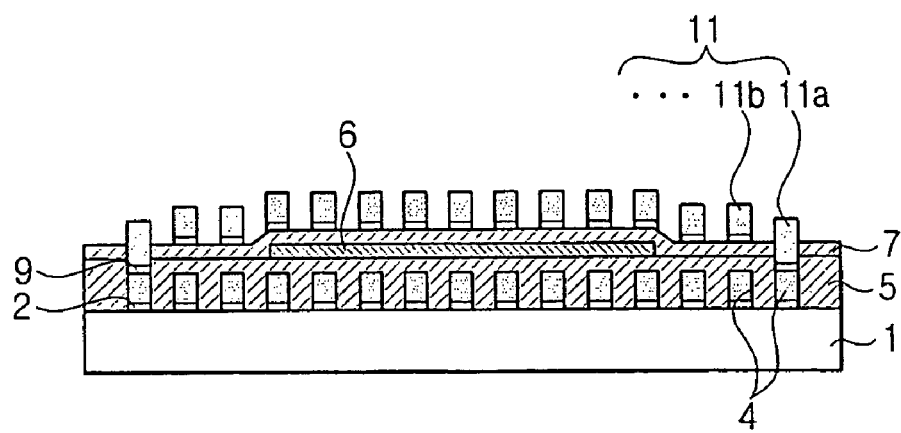

Korean Patent Application Nos. 2003-11807, filed Feb. 25, 2003, and 2003-34191, filed May 28, 2003, are incorporated herein by reference in their entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like reference numerals refer to like elements throughout.

The matters defined in the description such as a detailed construction and elements are nothing but the ones provided to assist in a comprehensive understanding of the invention. Thus, it is apparent that the present invention can be performed without those defined matters. Also, well-known functions or constructions are not described in detail since they would obscure the invention in unnecessary detail.

Figure 2A:
FIGS. 2A through 2K illustrate cross-sectional views of stages in a method for manufacturing a magnetic field detecting element according to an embodiment of the present invention.

FIGS. 2A through 2K illustrate views showing stages in a method for manufacturing a magnetic field detecting element according to an embodiment of the present invention. Referring to FIG. 2A, an oxidation film (not shown) for electric insulation is formed on a semiconductor substrate 100, and a first seed film 102 for plating is formed on the oxidation film.

Figure 2B:
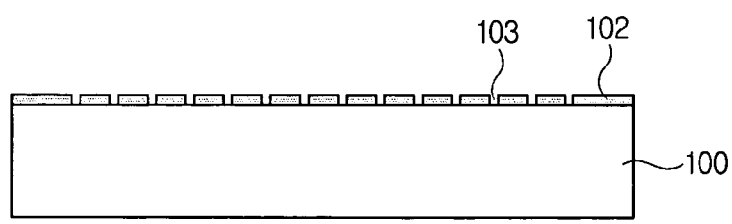
Figure 3A:
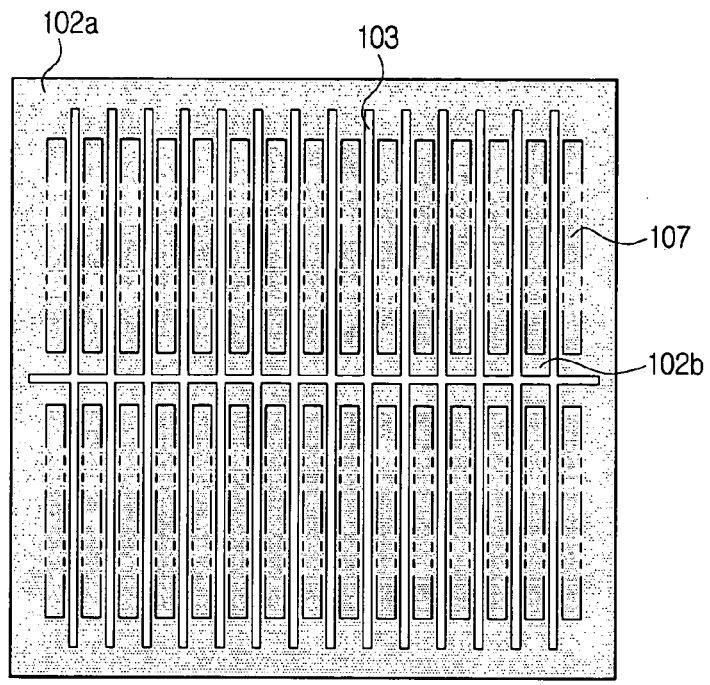
FIG. 3A illustrates a plan view showing a status that a seed film formed on a semiconductor substrate is removed by a predetermined pattern.
Figure 3B:
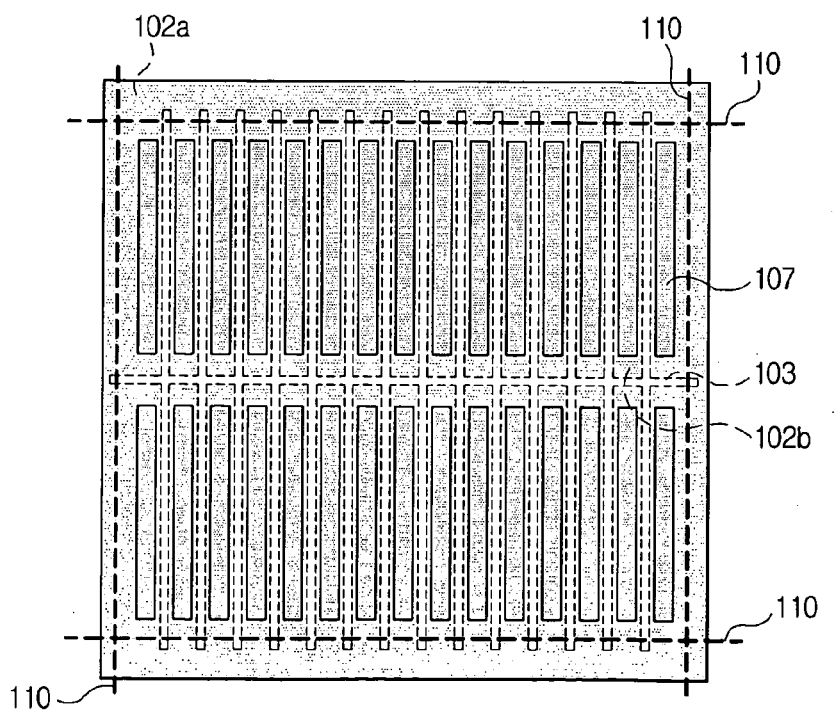
FIG. 3B illustrates a plan view showing a cut-off line for cutting off the semiconductor substrate in order to insulate coil lines after forming a plurality of coil lines on the seed film shown in FIG. 3A.

Next, as shown in FIG. 2B, the first seed film 102 formed on the semiconductor substrate 100 is partially removed using a predetermined pattern such as that shown in FIG. 3A. The partial removal of the first seed film 102 is for insulating, in a simple manner, a plurality of coil lines constituting a first coil that is subsequently formed on the first seed film 102. In FIGS. 2B and 3A, reference numeral 103 indicates a seed film pattern to be removed from the first seed film 102. In FIG. 3A, reference numeral 107 indicates a position of a subsequently formed plurality of coil lines. As shown in FIG. 3A, the pattern 103 is positioned between adjacent coil lines of the plurality of coil lines 107, and each one of the plurality of coil lines is partitioned from adjacent coil lines and connected through the seed film 102 (of FIG. 2B) at edges thereof 102*a*. As a result, as shown in FIG. 3B, if four lines 110 connecting the edges 102*a* of the pattern 103 are cut, the positions of the coil lines are insulated from each other.

Partial removal of the first seed film 102 of FIG. 2A is performed by first applying a photoresist layer (not shown) on the first seed film 102 and exposing and developing the photoresist layer to form a pattern. Then, the seed film pattern 103 to be removed is etched using the photoresist pattern as an etching mask. The seed film pattern 103 to be removed is formed such that parts 102*b*, where a plurality of coil lines 107 constituting a first coil 106 (of FIG. 2D) are to be formed, are insulated from each other, and edges 102*a* are connected to each other as shown in FIG. 3A.

The seed film 102 is electrically connected from a viewpoint of the entire semiconductor substrate 100, but the parts 102*b*, where the plurality of coil lines 107 constituting the first coil 106 are to be formed, are formed in such a way that the parts 102*b* can be electrically insulated from each other if the connection parts, i.e., the edges 102*a*, are cut. Here, generally, the first coil is formed in such a way that an exciting coil and a magnetic field detecting coil are wired one time by turns. Also, only one of either the exciting coil or the magnetic field detecting coil may be wired in a form of a solenoid. Then, the pattern 103 of the seed film 102 is removed through etching, the photoresist is removed, and partial removal of the seed film 102 is complete, as shown in FIG. 2B.

Figure 2C:
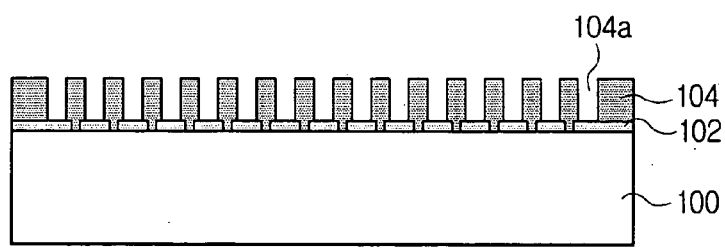
Figure 2D:
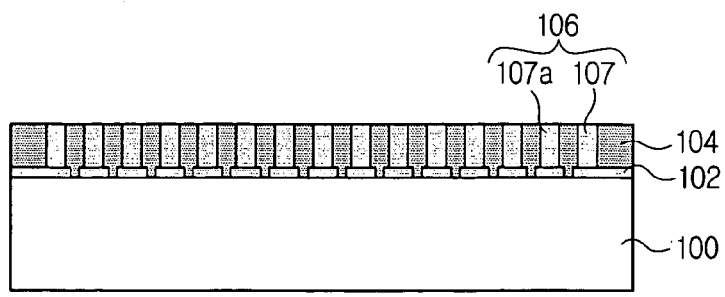

Referring to FIG. 2C, a first plating mold 104 is formed on an upper surface of the first seed film 102, which has been partially removed using the predetermined pattern 103, and a thick photoresist layer is formed, exposed and developed on the first plating mold 104, thereby forming a plurality of grooves 104a in the first plating mold 104. Each of the plurality of grooves 104a of the first plating mold 104 is filled with metal, thereby forming a plurality of coil lines 107, 107a, etc., which form the first coil 106, as shown in FIG. 2D. If the metal is deposited by electric plating, metal sticks to and grows on the seed film 102 at a bottom of the grooves 104a, whereby the plurality of coil lines 107, 107a, etc. is formed.

Figure 2E:
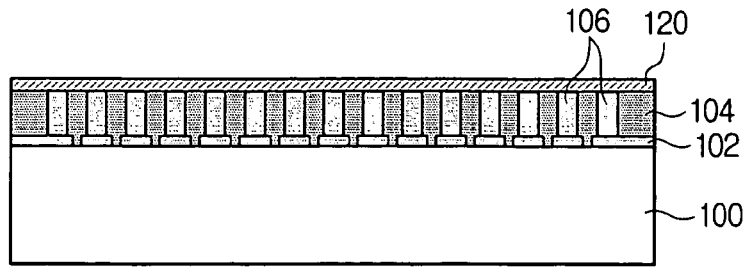
Figure 2F:
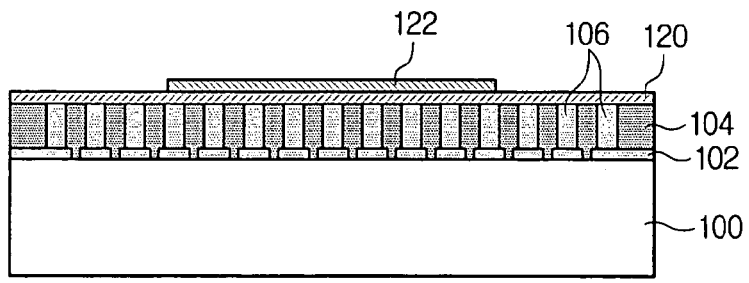

After planarizing or otherwise leveling an upper surface of the first plating mold 104, a first insulating film 120 is formed to a predetermined thickness on the level upper surface of the first plating mold 104, as shown in FIG. 2E. Then, a soft magnetic material film (not shown) is stacked on an upper surface of the first insulating film 120 and a soft magnetic core 122 is formed by pattern formation and etching of the soft magnetic material film, as shown in FIG. 2F.

Figure 4:
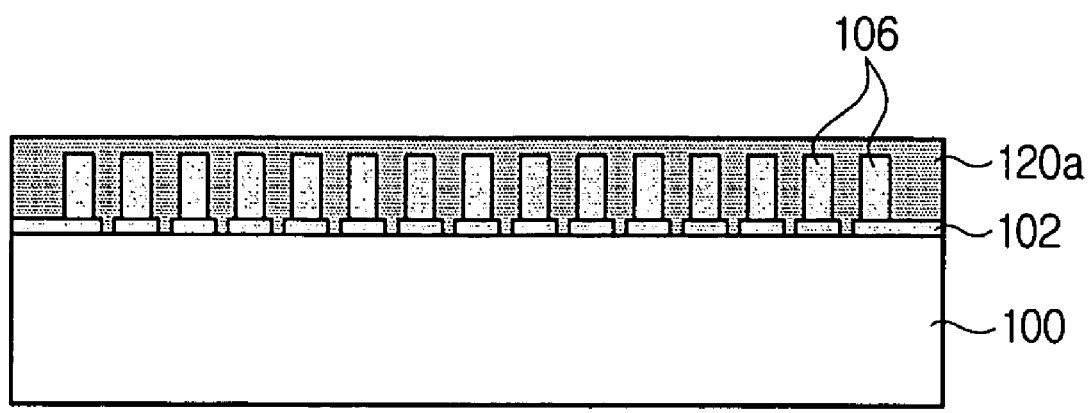
FIG. 4 illustrates a cross-sectional view of a modified example of a method for manufacturing a magnetic field detecting element according to an embodiment of the present invention.

An insulating film for forming the soft magnetic core 122 may be formed such that the first plating mold 104 is removed and the insulating material is formed on the semiconductor substrate 100 to have a height greater than that of the first coil 106, so that a first insulating film 120a is formed, as shown in FIG. 4. Forming the insulation film 120a for forming the soft magnetic core 122 according to such a method eliminates the need to perform a planarization process.

Figure 2G:
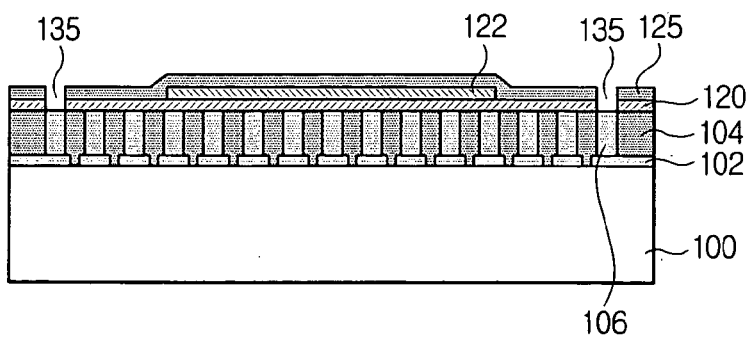

After the soft magnetic core 122 is formed, a second insulating film 125 is formed to a predetermined thickness on the first insulating film 120 of the semiconductor substrate 100, as shown in FIG. 2G. Then, via holes 135 for communicating with coil lines that form both ends of the first coil 106 are formed through the second insulating film 125.

Figure 2H:
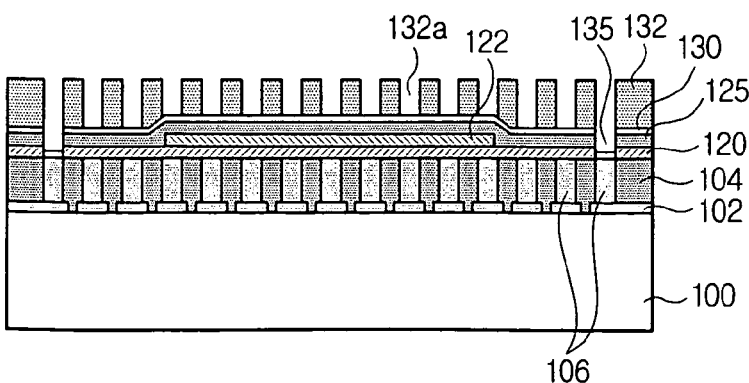

Then, as shown in FIG. 2H, a second seed film 130 is formed on an upper surface of the second insulating film 125 and a photoresist (not shown) is thickly spread on the second seed film 130. A second plating mold 132 having a pattern that corresponds to a shape of a second coil 136 (of FIG. 2I), i.e., a plurality of grooves 132a, is formed by exposing and developing processes. At this time, the second coil 136, which corresponds to the first coil 106, may be formed in such a way that an exciting coil and an magnetic field detecting coil are wired one time by turns, or only one of either the exciting coil or the magnetic field detecting coil may be wired in a form of a solenoid.

Figure 2I:
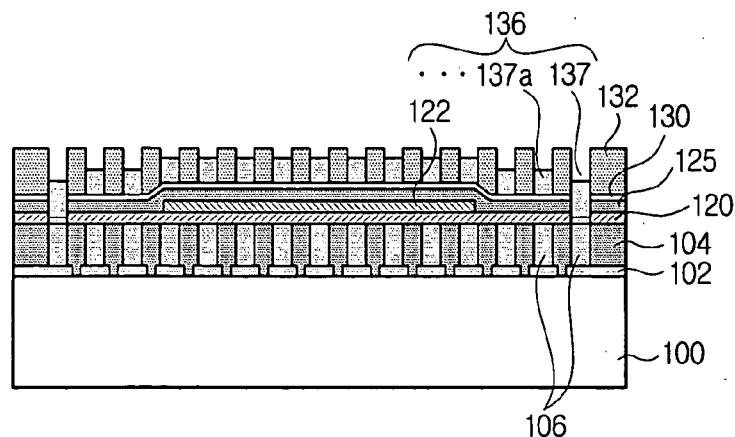
Figure 2J:
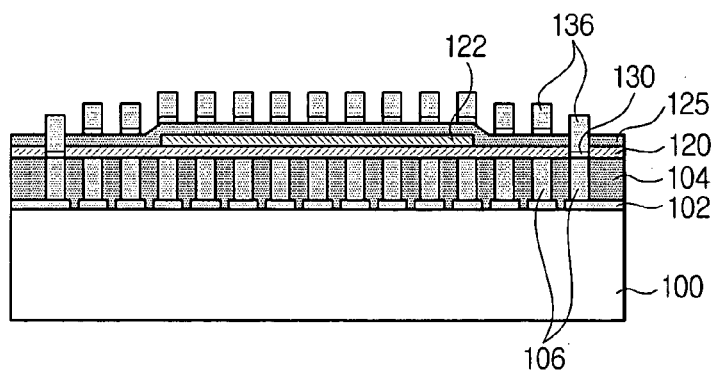

Each of the plurality of grooves 132a of the second plating mold 132 is then filled with metal by electric plating so that a plurality of coil lines 137, 137a, etc. constituting the second coil 136 is formed, as shown in FIG. 2I. Then, if the second plating mold 132 and the seed film under that second plating mold 132 are removed, a magnetic field detecting element having the second coil 136 is obtained, as shown in FIG. 2J.

Figure 2K:
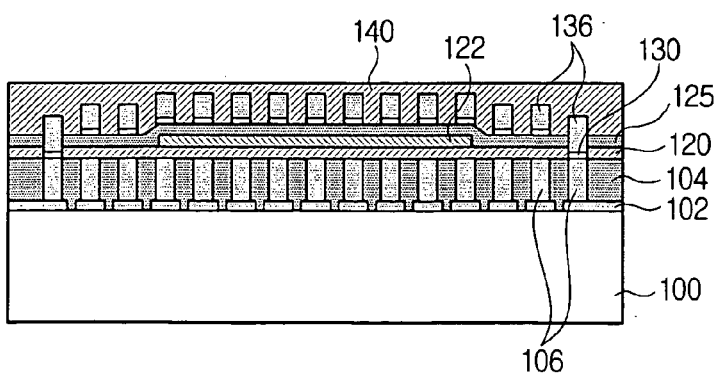

In FIG. 2K, a protection film 140 for protecting structures including the second coil 136 is formed on an upper portion of the second coil 136.

As previously described, after the first coil 106, the soft magnetic core 122, and the second coil 136 are formed on the semiconductor substrate 100, edge portions 102a of the first seed film 102 are cut off along a cut-off line 110, as shown in FIG. 3B, by a dicing process. Thus, as shown in FIG. 3B, each of the plurality of coil lines 107 constituting the first coil 106 is electrically separated and insulated from the others.

FIGS. 5A through 5I illustrate cross-sectional views showing stages in another method for manufacturing a magnetic field detecting element according to an embodiment of the present invention.

In FIGS. 5A through 5I, processes up to a process for forming the second insulating film 125 after forming the oxidation film on the semiconductor substrate 100, as shown in FIGS. 5A through 5E, are the same as those in the foregoing embodiment shown in FIGS. 2A through 2G. Therefore, a detailed description thereof will be omitted.

Figure 5A:
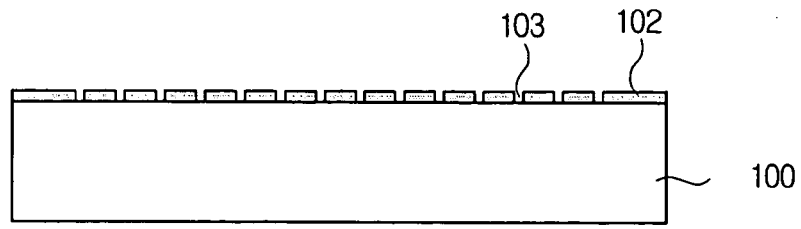
FIGS. 5A through 5I illustrate cross-sectional views of stages in a method for manufacturing a magnetic field detecting element according to another embodiment of the present invention.
Figure 5B:
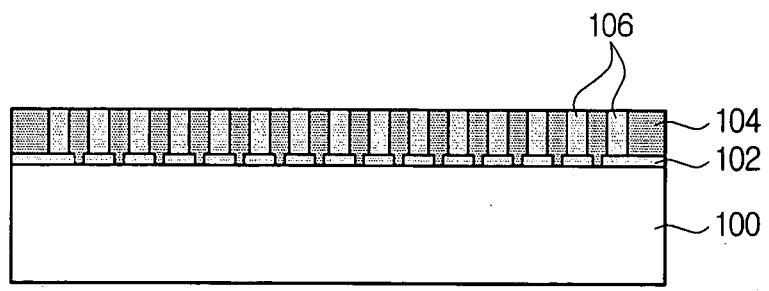
Figure 5C:
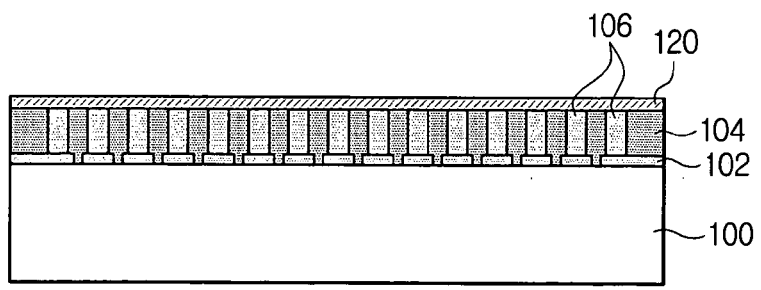
Figure 5D:
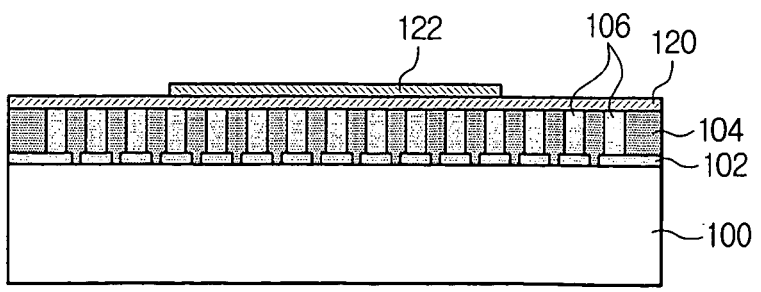
Figure 5E:
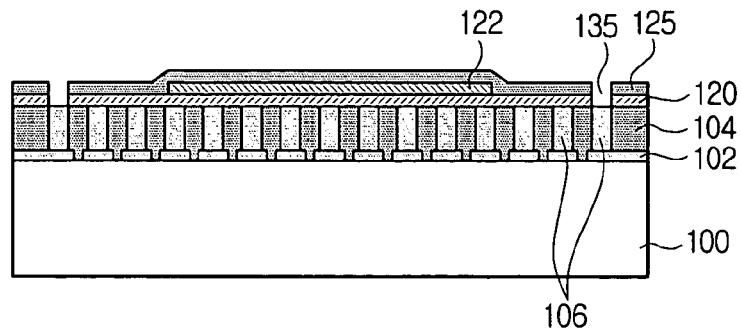
Figure 5F:
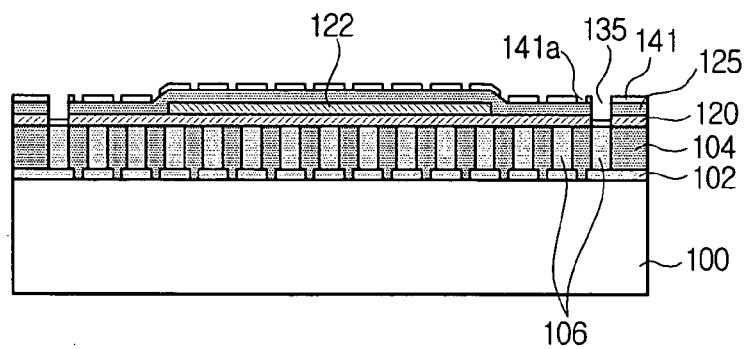

As shown in FIG. 5F, a second seed film 141 is formed on an upper surface of the second insulating film 125, and the second seed film 141 is partially removed in a manner similar to that used for partial removal of the first seed film 102. Namely, after a photoresist (not shown) is thickly spread on the second seed film 141, a seed film pattern 141a to be removed is formed by exposing and developing processes. At this time, the seed film pattern 141a to be removed is formed in such a way that each one of the plurality of coil lines 137 constituting the second coil 136 is insulated from each adjacent coil line, but each of the plurality of coil lines 137 is connected at edges of the seed film 141. More specifically, the seed film pattern 141a is formed in the same manner as the seed film pattern 103 of the above-described first seed film 102.

Therefore, if the semiconductor substrate 100 is cut off along its edges, each of the plurality of coil lines 137 is electrically separated and insulated from the others. It is preferable that a cut-off line (not shown) of the second coil 136 is overlapped on the cut-off line 110 of the first coil 106 so that the pluralities of coil lines 107, 137 constituting the first and the second coils 106, 136, respectively, are separated and insulated simultaneously by a single dicing process.

Figure 5G:
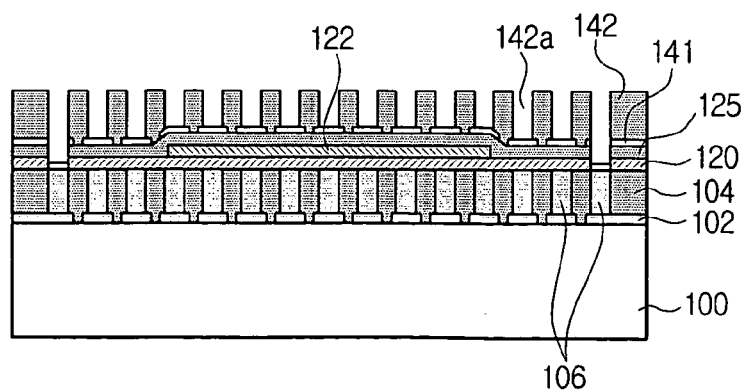
Figure 5H:
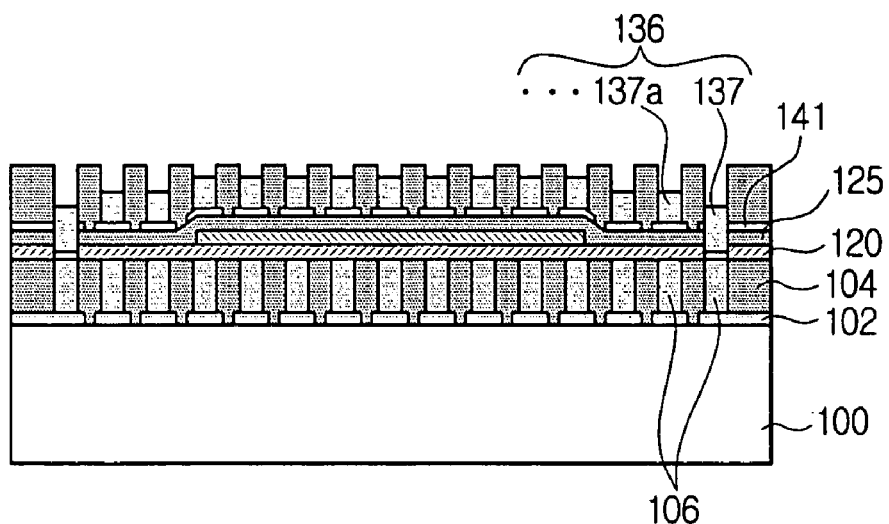

After formation of the seed film pattern 141a, a photoresist (not shown) is spread thickly on an upper surface of the second seed film 141 that has been partially removed by a predetermined pattern, and a second plating mold 142 having a pattern that corresponds to the second coil 136, i.e., a plurality of the grooves 142a, is formed by exposing and developing processes, as shown FIG. 5G. Then, as shown in FIG. 5H, each of the plurality of grooves 142a of the second plating mold 142 is filled with metal so that the plurality of coil lines 137, 137a, etc. is formed.

Figure 5I:
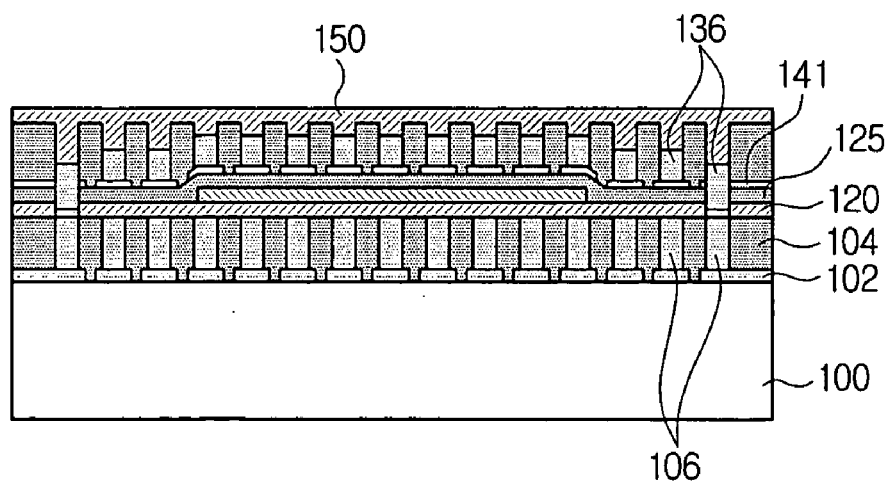

In FIG. 5I, a protection film 150 is then formed on an upper portion of a resultant structure including the second plating mold 142. Finally, the semiconductor 100 is cut off along edges thereof according to a cut-off line 110 by the dicing process, as shown in FIG. 3B.

According to methods for manufacturing a magnetic field detecting element of the present invention as described in the above embodiments, since a plating mold does not need to be removed to perform partial removal of a seed film, it is possible to provide a simplified manufacturing process for a magnetic field detecting element in which a material used for an insulating film is relatively unrestricted.

FIGS. 6A through 6H illustrate stages in a method for manufacturing a magnetic field detecting element according to still another embodiment of the present invention. FIGS. 7A through 7H illustrate cross-sectional views taken along line III—III of FIG. 6A through FIG. 6H, respectively.

Figure 6A:
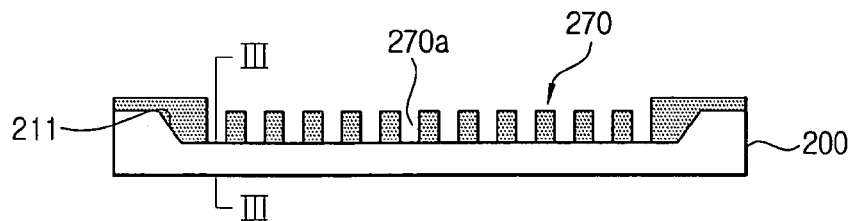
FIGS. 6A through 6H illustrate cross-sectional views of stages in a method for manufacturing a magnetic field detecting element according to still another embodiment of the present invention.
Figure 6B:
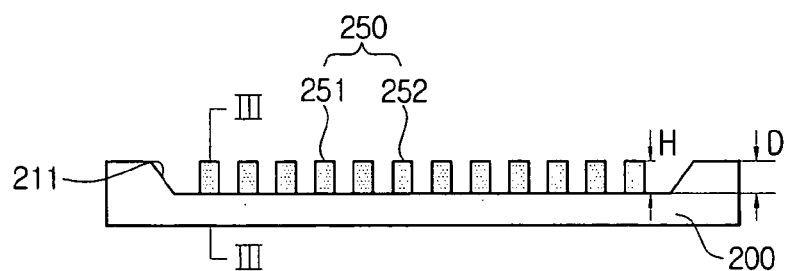
Figure 6C:
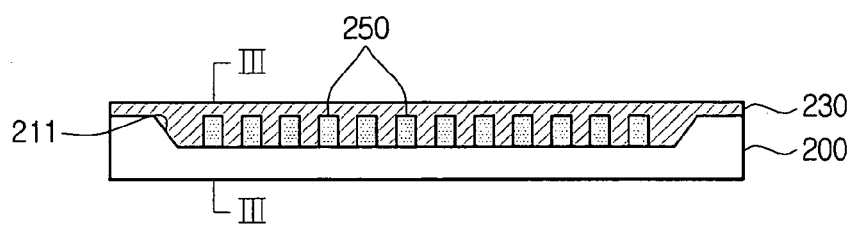
Figure 6D:
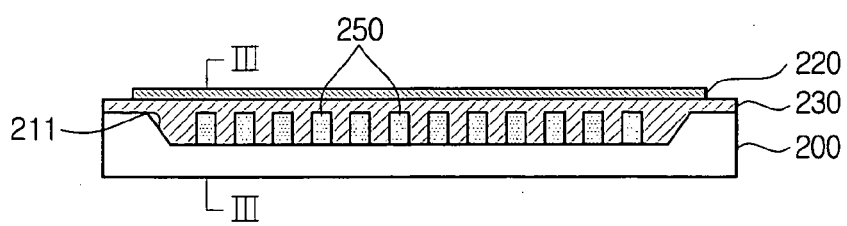
Figure 6E:
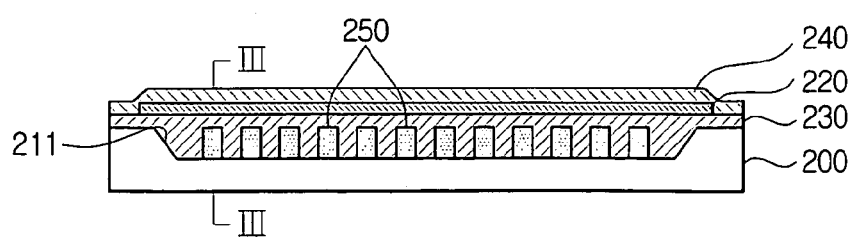
Figure 6F:
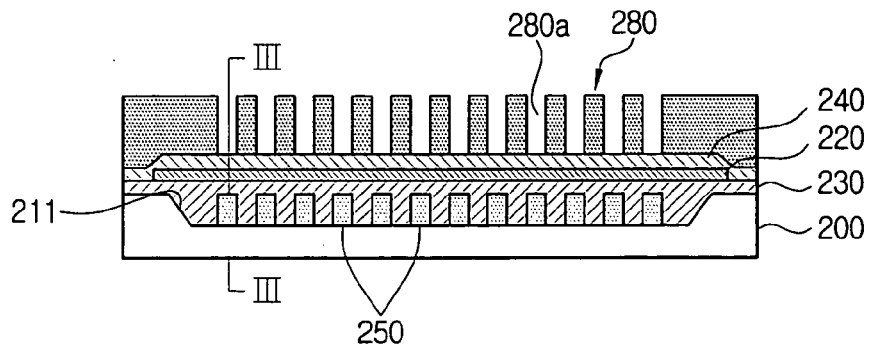
Figure 6G:
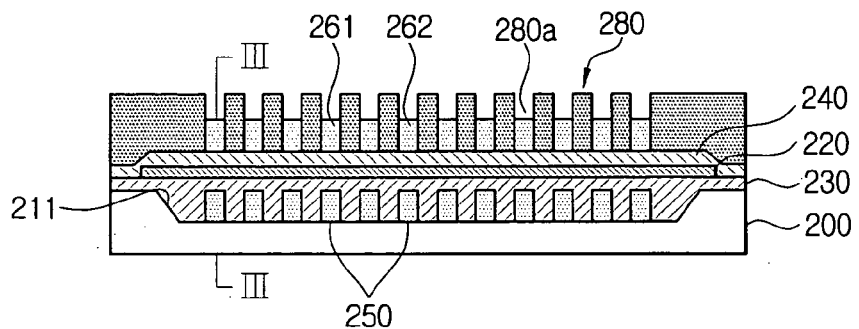
Figure 6H:
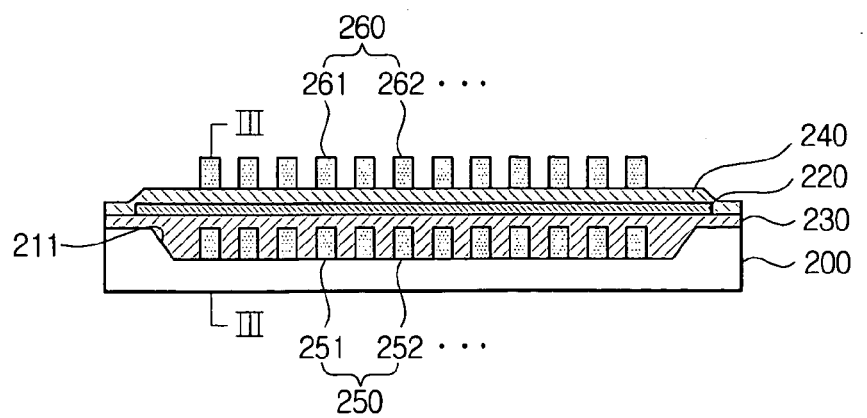
Figure 7A:
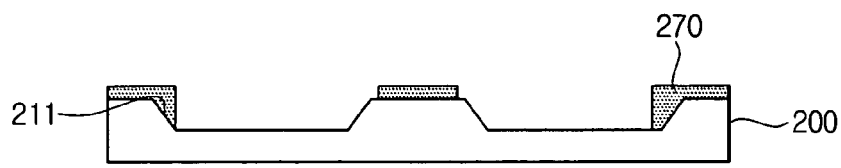
FIGS. 7A through 7H illustrate cross-sectional views taken along line III—III of FIGS. 6A through 6H, respectively.
Figure 7B:
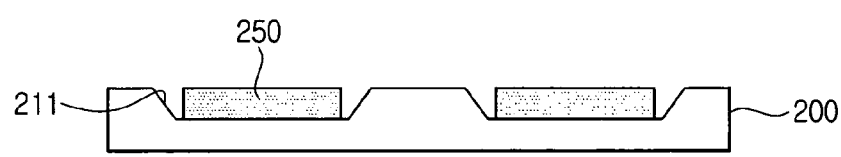
Figure 7C:
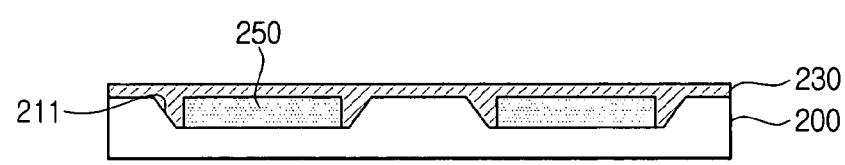
Figure 7D:
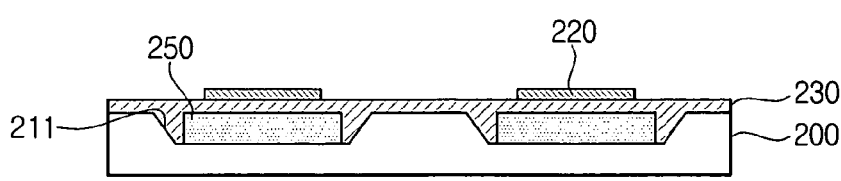
Figure 7E:
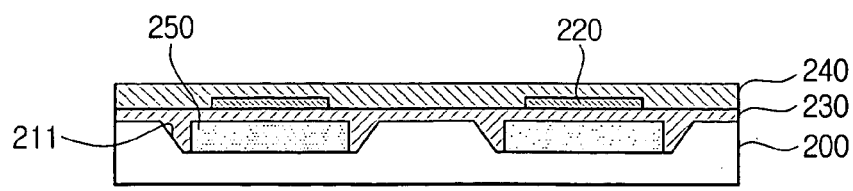
Figure 7F:
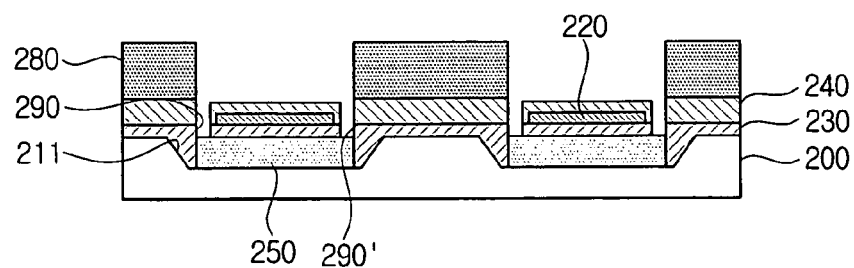
Figure 7G:
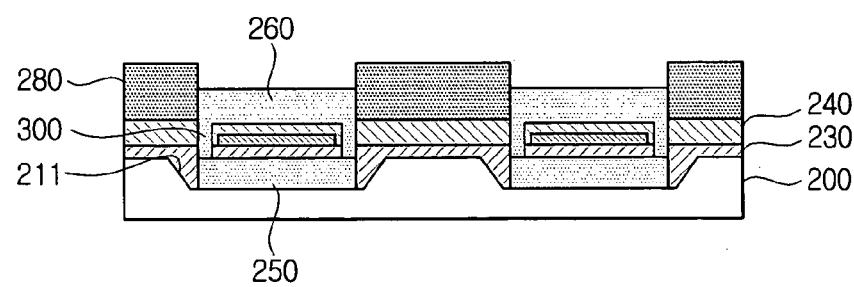
Figure 7H:
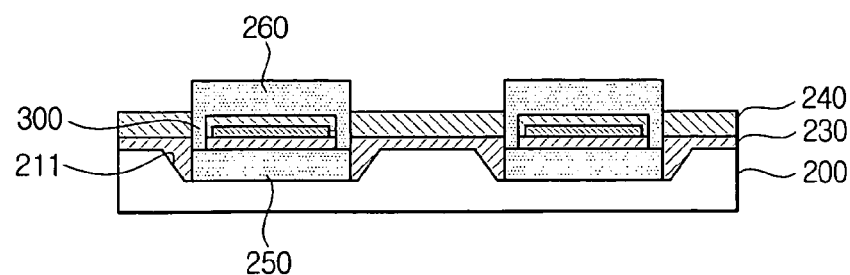

Referring to FIGS. 6H and 7H, a magnetic field detecting element manufactured according to a manufacturing method of the present invention includes a semiconductor substrate 200, a soft magnetic core 220, first and second insulating films 230, 240 positioned at upper and lower portions of the soft magnetic core 220, and first and second coils 250, 260 formed in such a manner that the first and second coils 250, 260 enclose the soft magnetic core 220 with the insulating films 230, 240 intervening between the soft magnetic core 220 and the first and second coils 250, 260, respectively, the first and second coils 250, 260 each having a plurality of coil lines 251, 252, . . . , and 261, 262, . . . , respectively.

The first coil 250 is positioned at a lower side of the soft magnetic core 220, and the second coil 260 is positioned at an upper side of the soft magnetic core 220. More particularly, the semiconductor substrate 200 has a well 211 formed therein to a depth (D of FIG. 6B) from an upper surface of the semiconductor substrate 200, and the first coil 250 is arranged within the well 211. Therefore, the first coil 250 may not be exposed to the surface of the semiconductor substrate 200.

A height (H of FIG. 6B) of the plurality of coil lines 251, 252, etc. constituting the first coil 250 formed within the well 211 is the same as the depth of the well 211. Therefore, an upper surface of the coil lines 251 maintains a same plane as the upper surface of the semiconductor substrate 200.

As described above, unlike a conventional magnetic field detecting element, since the first coil 250 does not project beyond the upper surface of the semiconductor substrate 200, but is formed in the well 211 of the substrate 200 to have an upper surface at a same plane as the upper surface of the semiconductor substrate 200, it is easy to planarize the semiconductor substrate 200, and it is possible to make a thickness of a planarization material, such as the insulating films 230, 240, to be thin.

Therefore, performance deterioration of a soft magnetic core generated due to unevenness in a conventional semiconductor substrate and difficulty in an etching process generated due to a thick insulating film in a conventional semiconductor substrate do not occur in the magnetic field detecting element manufactured according to an embodiment of the present invention, in which a magnetic field detecting element having high sensitivity and fine pitch between coils thereof may be formed.

The well 211 has an approximately rectangular shape, but has inner sidewalls of that are gradually inclined from an upper portion thereof to a bottom thereof, and which may be formed by a variety of the etching technologies generally well known in the art.

Also, as shown in FIGS. 7G and 7H, the first and second coils 250, 260 are connected by means of a third coil 300, which is formed upon formation of the second coil 260, by filling with metal through holes 290, 290' formed on both ends of the soft magnetic core 220 and passing through the first and second insulating films 230, 240.

A method for manufacturing the magnetic field detecting element of FIGS. 6H and 7H according to an embodiment of the present invention will now be described with reference to FIGS. 6A through 6G and FIGS. 7A through 7G.

FIGS. 6A and 7A illustrate cross-sectional views showing a first plating mold 270 for forming the first coil 250 formed on an upper surface of the semiconductor substrate 200 in which the well 211 is formed. Although not specifically shown in FIG. 6A or 7A, a seed film for plating is formed on a surface of the well 211, and the first plating mold 270 is formed by exposing and developing processes after a photoresist is thickly spread on the seed film. The first plating mold 270 has a plurality of grooves 270a.

If the seed film and the first plating mold 270 are removed after the plurality of grooves 270a of the first plating mold 270 are filled with metal by means of an electric plating method so that the plurality of coil lines 251, 252 is formed, the first coil 250 as shown in FIGS. 6B and 7B is formed in the well 211 of the semiconductor substrate 200. The first coil 250 does not project above the surface of the semiconductor substrate 200 but formed is in the same plane as the semiconductor substrate 200.

After that, as shown in FIGS. 6C and 7C, an insulating material is spread on the upper surface of the semiconductor substrate 200 in which the first coil 250 is formed, so that the first insulating film 230 for planarization and insulation is formed. The first coil 250 formed in the well 211 is not projected beyond an upper surface of the semiconductor substrate 200, but an upper surface of the first coil 250 is at a same plane as the upper surface of the semiconductor substrate 200, so that planarization of the semiconductor substrate 200 is easily performed, and the insulating film 230 may be formed to be very thin as well.

After the first insulating film 230 is formed, a soft magnetic material film is stacked on the first insulating film 230 and the soft magnetic core 220 is formed by pattern formation and etching of the soft magnetic material film, as shown in FIGS. 6D and 7D.

Then, an insulating material is formed to a predetermined thickness on an upper surface of the first insulating film 230 including the soft magnetic core 220, so that a second insulating film 240, as shown in FIGS. 6E and 7E, is formed.

Portions of the second insulating film 240, which correspond to both ends of the soft magnetic core 220, are etched so that through holes 290, 290', as shown in FIG. 7F, are formed, and a process for forming the second coil 260 proceeds. At this time, since the thickness of the first and the second insulating films 230, 240 is very thin, according to a feature of the present invention, etching for formation of the through holes 290, 290' may be performed in a simple manner. Also, since it is possible to realize fine-pitched coils due to such simplification of the process, a magnetic field detecting element having high sensitivity may be manufactured.

The formation of the second coil 260 is performed in such a manner that a seed film (not shown) is formed on an upper surface of the second insulating film 240 in which the through holes 290, 290' are formed, and a photoresist is formed on the seed film. Then, the second plating mold 280 having a plurality of grooves 280a is formed by exposing and developing processes as shown in FIGS. 6F and 7F.

After the second plating mold 280 is formed, each of the plurality of grooves 280a is filled with metal by means of electric plating, so that a plurality of coil lines 261, 262 forming the second coil 260 is formed, as shown in FIGS. 6G and 7G. At this time, the through holes 290, 290' are filled with metal, thereby forming a third coil 300 connecting the first coil 250 at a lower side of the soft magnetic core 220 to the second coil 260 at an upper side of the soft magnetic core 220. Therefore, the coils 250, 260 are realized in such a manner that the coils 250, 260 enclose the soft magnetic core 220.

If the seed film and the second plating mold 280 are removed after the coil line 261 is formed, the second coil 260 is exposed, whereby a thin type magnetic field detecting element as shown in FIGS. 6H and 7H is manufactured. Here, the magnetic field detecting element manufactured by the present invention may reduce an entire height of the magnetic field detecting element by as much as the depth of the well 211 formed in the semiconductor substrate 200, thus a thin structure may be realized.

On an upper surface of the semiconductor substrate 200, a protection film for protecting structures formed thereon may be formed.

As is apparent from the foregoing, according to the present invention, since a first coil is not projected beyond an upper surface of a semiconductor substrate but is positioned within a well formed in the semiconductor substrate, it is easy to perform planarization of the semiconductor substrate, and it is possible to reduce a thickness of a planarization material as well. Therefore, performance improvement of a soft magnetic core is expected due to improvement in a degree of planarization. Further, simplification of an etching process for forming a through hole is expected due to realization of a thin insulating film. Also, a pitch between coils may be reduced due to simplification of the etching process, thus sensitivity of a sensor may be improved.

According to the various embodiments of the present invention, manufacturing of a magnetic field detecting element is simplified, whereby productivity improvement is expected and a thin-type element of good sensitivity may be manufactured as well.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method for manufacturing a magnetic field detecting element having a soft magnetic core formed on a semiconductor substrate, first and second coils arranged on upper and lower surfaces of the soft magnetic core, respectively, the first and second coils each having a plurality of coil lines, the method comprising:

forming a first seed film to a predetermined thickness on the semiconductor substrate;

removing a portion of the first seed film using a predetermined pattern so that each of the plurality of coil lines constituting the first coil that would be is subsequently formed on a remaining portion of the first seed film is separated from the others;

forming a first plating mold having a plurality of grooves corresponding to the predetermined pattern, on an upper portion of the first seed film;

forming the plurality of coil lines constituting the first coil by filling the plurality of grooves of the first plating mold with metal;

forming the soft magnetic core and the second coil on an upper portion of the semiconductor substrate and on the remaining portion of the seed film where the first coil is formed; and cutting off edges of the semiconductor substrate so that each of the plurality of coil lines separated by the predetermined pattern are insulated from each other.

2. The method as claimed in claim 1, wherein removing the portion of the first seed film further comprises:

forming a photoresist layer on an upper surface of the first seed film;

exposing and developing the photoresist to form the predetermined pattern; and etching the first seed film according to the predetermined pattern.

3. The method as claimed in claim 1, wherein filling the plurality of grooves of the first plating mold with metal comprises electric plating.

4. The method as claimed in claim 1, wherein forming the soft magnetic core further comprises:

planarizing an upper surface of the semiconductor substrate on which the first coil is formed;

spreading an insulating film on the planarized upper surface of the semiconductor substrate;

spreading a soft magnetic material film on an upper surface of the insulating film;

forming a photoresist layer on the soft magnetic material film and exposing and developing the photoresist layer to form a pattern of the soft magnetic core; and etching the soft magnetic material film according to the pattern.

5. The method as claimed in claim 1, wherein forming the soft magnetic core comprises removing the first plating mold;

forming an insulating film to a height greater than a height of the first coil, on an upper surface of the semiconductor substrate from which the first plating mold has been removed;

spreading a soft magnetic material film on an upper surface of the insulating film;

forming a photoresist layer on the soft magnetic material film and exposing and developing the photoresist layer to form a pattern of the soft magnetic core; and etching the soft magnetic material film according to the pattern.

6. The method as claimed in claim 1, wherein forming the second coil further comprises:

forming a second insulating film on the semiconductor substrate where the soft magnetic core is formed;

forming a second seed film on an upper surface of the second insulating film;

removing the second seed film using a predetermined second pattern so that a plurality of coil lines constituting the second coil to be subsequently formed on the second seed film are separated from each other;

forming a second plating mold having a plurality of grooves that corresponds corresponding to the second pattern, on an upper portion of the second seed film; and forming a plurality of coil lines constituting the second coil by filling the plurality of grooves groove of the second plating mold with metal, and wherein cutting off edges includes cutting off edges on sides of the semiconductor substrate so that each of the plurality of coil lines constituting the first and the second coils separated by the first and the second patterns are insulated from each other.

7. The method as claimed in claim 6, wherein filling the plurality of grooves of the first and the second plating molds with metal comprises an electric plating.

8. The method as claimed in claim 6, wherein forming the soft magnetic core further comprises:
   planarizing an upper surface of the semiconductor substrate on which the first coil is formed;
   spreading a first insulating film on the planarized upper surface of the semiconductor substrate;
   spreading a soft magnetic material film on an upper portion of the first insulating film;
   forming a photoresist layer on the soft magnetic material film and exposing and developing the photoresist layer to form a pattern of the soft magnetic core; and
   etching the soft magnetic material film according to the pattern.

* * * * *